United States Patent [19]

Kyrian et al.

[11] 4,369,409
[45] Jan. 18, 1983

[54] LOW-FREQUENCY POWER AMPLIFIER

[75] Inventors: Bohumil Kyrian; Johann Milavec, both of Windisch; Wilhelm Tschol, Fislisbach, all of Switzerland

[73] Assignee: Patelhold Patentverwertungs- & Elektro-Holding A.G., Glarus, Switzerland

[21] Appl. No.: 175,362

[22] Filed: Aug. 5, 1980

[51] Int. Cl.³ .................. H03F 3/38; H03F 3/217
[52] U.S. Cl. ...................... 330/10; 330/251; 330/207 A
[58] Field of Search .......... 330/10, 251, 207 A, 330/124 R

[56] References Cited

U.S. PATENT DOCUMENTS 3,899,745  8/1975  Fletcher et al. .............. 330/251
4,164,714  8/1979  Swanson ..................... 330/10

FOREIGN PATENT DOCUMENTS 1218557  6/1966  Fed. Rep. of Germany.

OTHER PUBLICATIONS

Funk-Technik, Pulsdauermodulierte AM-Rundfunksender hoher Leistung, 1977, 3 pp.

Primary Examiner—James B. Mullins
Assistant Examiner—Gene Wan
Attorney, Agent, or Firm—Orville N. Greene

[57] ABSTRACT

A compact and inexpensive LF power amplifier is disclosed. A plurality of pulse trains which are phase shifted relative to each other are width-modulated by an input LF signal. The modulated pulse trains are individually amplified, preferably by means of a plurality of respective power transformers and switch elements. The switch elements include any suitable combination of electron tubes and semiconductor switches. The keying ratio of the amplifier is improved by associating the pulse trains in pairs, the two members of each pair being phase shifted 180° relative to each other. The amplified pulse trains are superimposed to form a single combined amplified pulse train.

33 Claims, 6 Drawing Figures

LOW-FREQUENCY POWER AMPLIFIER

BACKGROUND OF THE INVENTION

The present invention relates to a low-frequency (LF) power amplifier and to a preferred use of this amplifier.

The LF power amplifiers for high output powers of conventional types are nearly all built in accordance with the same basic circuit. They contain a negative feedback B-class amplifier having at least two amplifier tubes and an output transformer. The LF signal to be amplified is fed to the grid of the tubes, whose anodes are connected with the terminals of the primary winding of the output transformer. One terminal of the secondary winding of the output transformer is connected via a capacitor to ground, and the other terminal is connected to the load. The feed voltage for the two LF amplifier tubes is fed via a center tap of the primary winding of the output transformer.

LF power amplifiers of the type described can be adapted for very different uses and designed for use at correspondingly different powers, for instance for the excitation of large loudspeakers, in inductive heating devices, in control amplifiers, and as modulation amplifiers for radio transmitters.

All conventional embodiments have certain basic disadvantages for high power output. For the negative-feedback B-class amplifier high-power tubes are necessary, which are expensive and have a comparatively short operating life. These tubes must be operated at high voltage in amplifiers having a high output power, which increases the cost and the overall power consumption of the circuit. The output transformer is a large, heavy component the weight of which may reach six tons in a modulation amplifier for a 300 kW transmitter. Finally, the efficiency of a negative-feedback B-class amplifier controlled by sinusoidal signals and of the load connected to it is dependent upon the degree of modulation; the overall efficiency of the amplifier and load is at best 70%.

The well-known principle of pulse-width modulation offers advantages with respect to efficiency but on the other hand has circuit difficulties inherent in it.

One known solution, disclosed in German Pat. No. 1,218,557, issued Feb. 8, 1963, is characterized by the fact that pulse-width modulated signals are applied in a suitable manner to the control grid of a switch tube, which is at high potential between a high voltage rectifier and the load.

Another solution is disclosed in the journal Funk-technik, vol. 32., No. 13/1977, in which a HF output stage tube is connected in series with a switch tube, which is controlled by pulse-width modulation, the cathode of the HF output-stage tube being grounded with respect to high frequency but oscillating in the rhythm of the oscillation frequency.

SUMMARY OF THE INVENTION

The object of the present invention is to create a simple LF power amplifier which is not costly, and which both avoids the aforementioned disadvantages with respect to efficiency and expense and eliminates the difficulties with respect to circuitry expense of the two known methods of pulse-width modulation which have been mentioned above.

It is a further object of the invention to provide an LF-power amplifier which can be operated at a medium voltage and which as a whole has a high efficiency that is independent of the degree of modulation.

According to the invention, an LF power amplifier is provided with a pulse modulator which converts an LF input signal into at least two pulse trains, 180° apart in phase, which have the same frequency and which comprise width-modulated pulses. The amplifier also includes at least two switch stages, which are respectively controlled by the pulse trains. The feed voltage inputs of the switch stages are connected in parallel while their outputs are separated galvanically from the inputs and are connected in series along a connecting line. A low-pass filter is also provided, at whose output the power-amplified LF signal appears.

The conversion of the LF signal into pulses makes it possible to use, instead of amplifier tubes, suitable electronic switches having a very short switching time, which improve the efficiency of the amplifier while producing the same output power as tubes. Furthermore, the cascade circuit of the switch-element outputs makes it possible to operate the power amplifier with a low feed voltage, which very substantially simplifies and reduces the cost of the construction. Finally, by the use of a plurality of switch stages connected in groups in parallel or in series, useful redundance of the entire LF power amplifier can be obtained so that its operability is not noticeably impaired by failure of one of the stages.

For the purpose of illustrating the invention, there is shown in the drawings an embodiment which is presently preferred; it is to be understood, however, that the invention is not limited to the precise arrangements and instrumentalities shown.

DETAILED DESCRIPTION OF THE PREFERRED EMBODIMENT

Figure 1:
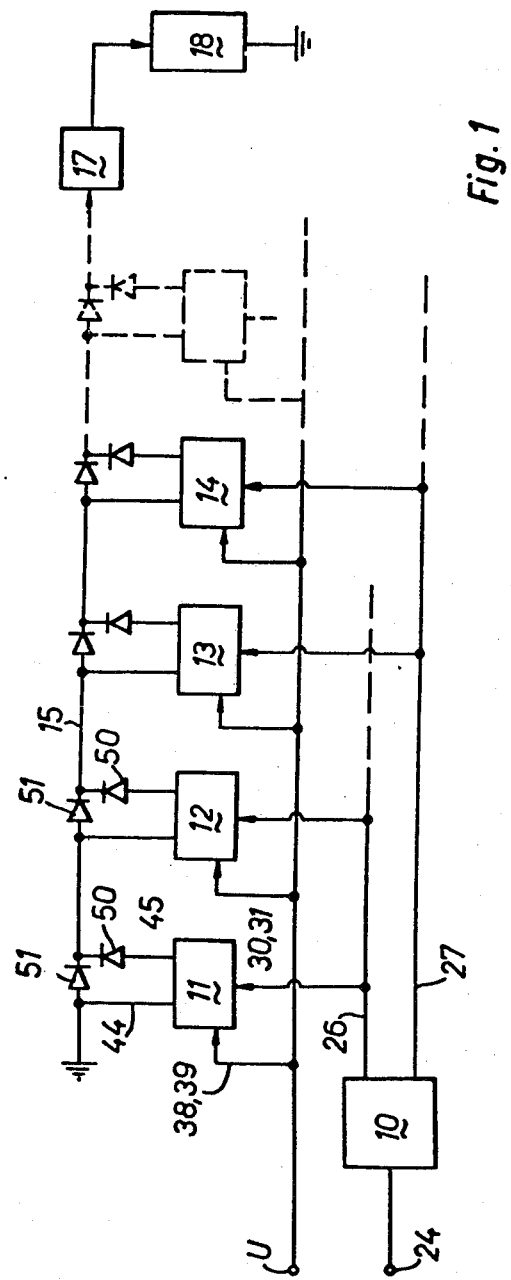
FIG. 1 shows a basic diagram of a preferred embodiment of the LF power amplifier of the invention.

The embodiment of an LF power amplifier shown in FIG. 1 is intended to be used to feed an amplitude-modulated radio transmitter. A power amplifier intended for this use must meet particularly stringent requirements with respect to frequency response and gain, for which reason it is particularly well suited for description of the construction and manner of operation of the amplifier of the invention.

The LF power amplifier of the invention contains a pulse modulator 10, and two pairs of switch stages 11, 12 and 13, 14. The number of switch stages may, however, be any even number. Each two switch stages 11, 12 and 13, 14 are connected in parallel. A connecting line 15 together with diodes 51, which separate the outputs of the several switch stages, combines the outputs of all switch stages 11–14 and applies them to the input of a low-pass filter 17, whose output is connected to a load 18. In the example shown it is assumed that the load is the HF output stage of an amplitude-modulated transmitter. A diode 50 is disposed in one output of each switch stage 11–14. Diodes 51, as noted, serve to connect the switch stages to form a cascade circuit.

Figure 2:
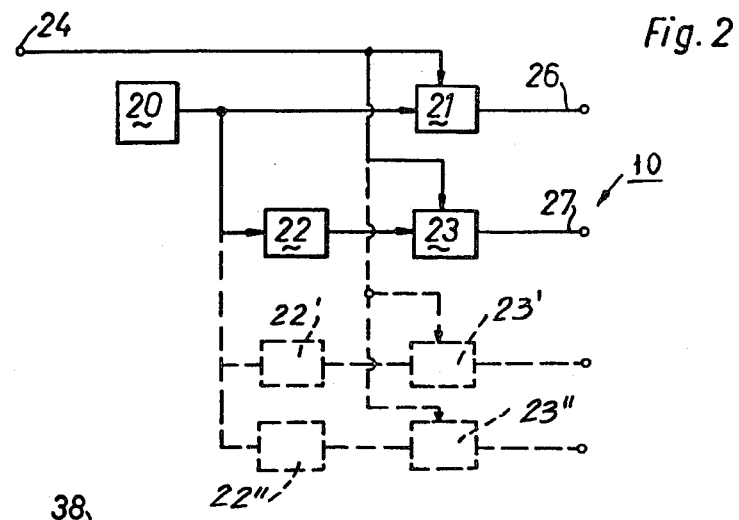
FIG. 2 is a block diagram showing a pulse modulator which is suitable for use in the LF power amplifier of FIG. 1.

FIG. 2 shows the block diagram of a suitable pulse modulator 10. It includes a pulse generator 20 whose output is connected with an input of a modulator circuit 21 and the input of at least one phase shift circuit 22. The output of the phase shift circuit 22 is fed to one input of another modulator circuit 23. The LF signal is applied to the other input of modulator circuit 23 via input terminal 24. A respective signal line 26, 27 is connected to the output of each modulator circuit 21, 23.

As will be described below, it may be advantageous to use a pulse modulator which supplies more than two output signals. In such case, additional phase shift circuits connected to respective modulator circuits are connected to the pulse generator 20, as indicated by the dashed lines in FIG. 2.

Figure 3:
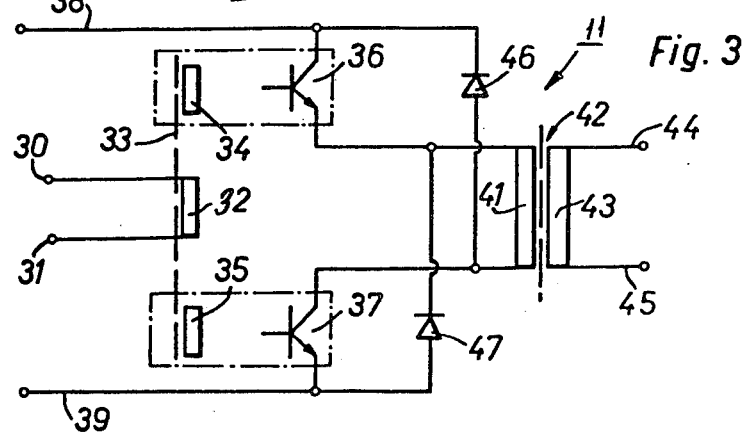
FIG. 3 is a block diagram showing a switch stage suitable for use in the LF power amplifier of FIG. 1.

FIG. 3 shows the block diagram of a switch stage 11 which is suitable for use in the LF power amplifier of the invention. Switch stage 11 includes signal input terminals 30, 31 to which one of the signal lines 26 and 27 from the pulse modulator 10 is connected. Terminals 30, 31 are connected to the primary winding 32 of a control unit indicated by broken line 33. The secondary windings 34, 35 of control unit 33 are each connected with the control terminal of at least one associated switch element 36, 37, respectively. (One or more additional switch elements may be connected in parallel with each of the switch elements 36, 37 shown, to ensure that the switch stage will continue to function properly in the event that one of the switch elements fails.) Each of the switch elements 36, 37 has one terminal connected with the positive or the negative bar 38, 39 of the source of feed voltage, respectively, and has another terminal connected with a respective terminal of the primary winding 41 of a power transformer 42. The secondary winding 43 of power transformer 42 is connected with the output lines 44, 45.

The switch stage 11 also includes two diodes 46, 47. Diode 46 is connected between the "negative" terminal of the primary winding 41 of the power transformer 42 (the lower terminal in FIG. 3) and the bar 38 for the positive feed voltage, and diode 47 is connected between the "positive" terminal (the upper terminal in FIG. 3) of primary 41 and the bar 39 for the negative feed voltage. Diodes 46, 47 protect the switch elements 36, 37 against overvoltage when the current is interrupted.

In a preferred embodiment of the switch stage 11, two control units 33 are provided, one of which transmits the connect pulse for the switch elements 36, 37 and the other of which transmits the disconnect pulse. Furthermore, instead of the two single switch elements 36, 37 shown, there can be used two groups of switch elements connected in parallel, which makes it possible correspondingly to increase the current through the primary winding of the power transformer 42. Switch elements 36, 37 are preferably power semiconductor elements, electron tubes or a suitable combination thereof.

Figure 4:
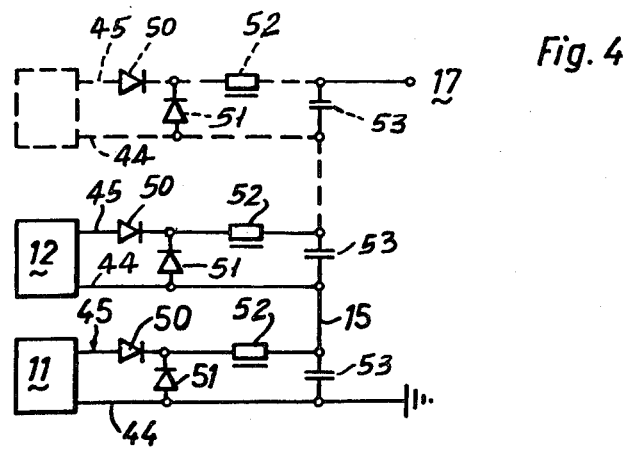
FIG. 4 is a schematic diagram of an integrated low-pass filter.

The circuit arrangement of the low-pass filter need not necessarily be developed in accordance with FIG. 1. For example, the low-pass filter may be integrated, in whole or in part, in the output lines 44, 45 of the switch stages 11, 12, . . . or in the connecting line 15. An embodiment of this type is shown in FIG. 4, in which one output line 45 includes a resistance 52, with which capacitance 53 between output lines 44 and 45 cooperates to act as a low-pass filter. A similar arrangement is provided for each switch stage 11, 12, etc.

When constructing the LF power amplifier of the invention, the connect frequency of the ordinary switch elements 11–14 is limited, and the keying ratio, due to the remagnetizing of the power transformers, is limited to about 1:1 (or 50% modulation).

In order to improve the keying ratio or the modulation of the output pulse train, the LF signal is converted into at least two trains of width-modulated pulses having the same predetermined frequency and amplitude. The trains are grouped in pairs, the two trains of each pair being shifted from each other in phase by 180°. In addition, the trains of different pairs are phase-shifted relative to each other by such amounts that a superposition of all of the n trains (n being an integer not less than 2) is a train of evenly spaced pulses having a frequency equal to n times the frequency of the n trains. These n pulse trains are amplified separately from each other by respective switch stages and then fed to a common line 15, which is galvanically separated from the feed voltage. The output pulse train, which is the superposition of the n input pulse trains, is then converted by the low-pass filter 17 into a power-amplified LF signal which corresponds to the original LF signal.

Figure 5:
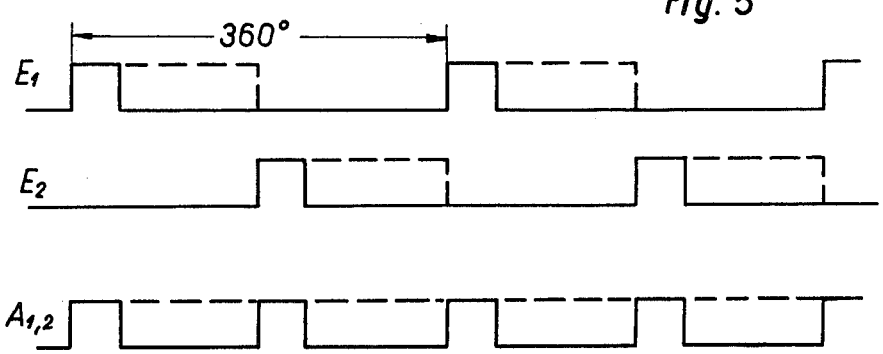
FIG. 5 is a timing diagram showing the modulation of an output pulse train by the superimposition of two input pulse trains which are shifted in phase from each other.

For example, two input pulse trains, shifted in phase by 180° from each other, may be used, as shown diagramatically in FIG. 5. The two input pulse trains $E_1$ and $E_2$ have the same pulse train frequency and a phase difference relative to each other of 180°. The pulse width shown in solid lines corresponds to a modulation of 12.5% while the pulse width shown in dashed lines corresponds to a modulation of 50% per input-pulse train. As shown in FIG. 5, the superposition of these two input pulse trains $E_1$ and $E_2$ results in an output pulse train $A_{1,2}$ which is practically 100% modulated when the two input pulse trains are each 50% modulated.

In order to produce the input pulse trains $E_1$ and $E_2$, the pulse modulator 10 shown in FIG. 2 is used. The pulse generator 20 produces a train of triangular pulses whose frequency is lower than the highest switching frequency of the switch elements 36, 37. These triangular pulses are superimposed by the modulator circuit 21 with the LF signal applied at the input terminal 24, thereby producing, in a known manner, width-modulated pulses which are fed to the output signal line 26. The triangular pulses produced by the pulse generator 20 are also conducted to the phase shift circuit 22 which shifts the pulses 180°, or half the distance in time between two pulses. This phase-shifted pulse train is superimposed by the modulator circuit 23 with the LF signal input via terminal 24, in order to form width-modulated pulses which appear on the output signal line 27.

It is self-evident that other types of pulse modulation can also be used and that the pulse modulator need not necessarily be constructed in the manner shown in FIG. 2. For example, it is also possible to use a pulse generator which produces sawtooth pulses, or simply a series of clock pulses, upon the appearance of which the LF signal is scanned. In an associated logic circuit, pulses which are width-modulated according to the amplitude of the LF signal are formed. Such methods and devices are well known to those skilled in the art and therefore do not need to be further discussed here.

Figure 6:
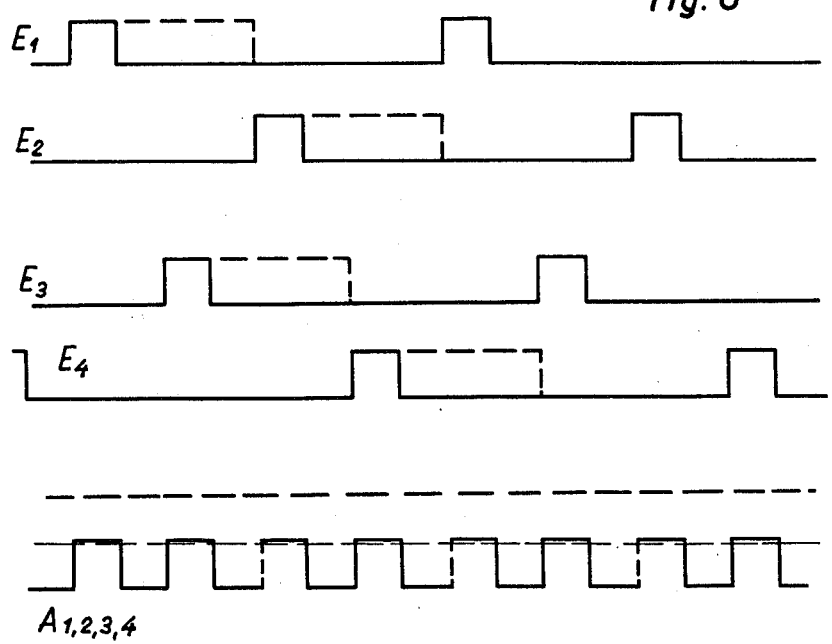
FIG. 6 is a timing diagram showing the increase in frequency of an output pulse train as a result of the superimposition of a plurality of phase-shifted input pulse train pairs.

As already mentioned, the frequency of the input pulse train on each of the signal lines is limited by the maximum connect frequency of the switch elements 36, 37. This results, in the case of the two 180° phase-shifted input pulse trains described, in an output pulse train of double the frequency of the input LF signal. In order to produce output pulse trains of still higher frequency, several pairs of pulse trains which are shifted in phase from each other as described above can be used. FIG. 6 shows diagrammatically the use of two pairs. In the upper part of FIG. 6 there are shown the above-described input-pulse trains $E_1$ and $E_2$ which are shifted 180° in phase relative to each other, while in the central part of FIG. 6 there is shown a second pair of pulse trains $E_3$ and $E_4$. Pulse trains $E_3$ and $E_4$ are also shifted in phase by 180° with respect to each other, and by 90° with respect to the corresponding pulse trains of the first pair of pulse trains, i.e. $E_3$ is shifted 90° with respect to $E_1$, and $E_4$ is shifted 90° with respect to $E_2$. The superimposition of these four input pulse trains then gives an output pulse train $A_{1,2,3,4}$ having four times the frequency of the individual input pulse train or, with 50% modulation, an output pulse train which consists of two superimposed pulse trains which are practically 100% modulated.

In order to produce four input pulse trains as shown in FIG. 6, the output of the pulse modulator 20 shown in FIG. 2 is connected to two additional phase shift circuits 22', 22'', which are connected to respective modulator circuits 23', 23'', as indicated by the dashed lines.

It is self-evident that the frequency of the output pulse train can be increased further if, for instance, four additional input-pulse trains are formed, each of which is shifted in phase by 45° with respect to a respective one of the input-pulse trains already described, etc.

Each pulse train has at least one switch stage associated with it. The incoming pulses switch the switch elements so that the primary winding 41 of the power transformer 42 is excited for a period of time proportional to the pulse width, and a power amplified pulse train galvanically separated from the input LF voltage appears at the output lines 44, 45. As already mentioned, a plurality of switch elements can be connected in parallel in each switch stage, in order to increase the power amplification, and several switch stages can also be connected in parallel to each other for the same purpose. The transformer ratio of the transformer windings is selected in accordance with the voltage desired for the power-amplified pulses.

The disclosed LF power amplifier makes it possible, with the described modulation of pair-wise associated input pulse trains shifted by 180° relative to each other, to modulate the output-pulse train to an extent practically of 100%, and by the use of several such input pulse train pairs to increase the frequency of the output pulse train to a multiple of the frequency of each input pulse train.

In one practically tested embodiment, the new LF power amplifier has been used to feed an amplitude-modulated radio transmitter with low frequency in the customary audio-frequency range with a peak power of more than 1 mW. For satisfactory transmission quality, the LF input signal in this case, as shown in FIG. 6, was modulated on two pairs of input pulse trains which are shifted in phase with respect to each other.

The present invention may be embodied in other specific forms without departing from the spirit or essential attributes thereof and, accordingly, reference should be made to the appended claims, rather than to the foregoing specification, as indicating the scope of the invention.

What is claimed is:

1. An LF power amplifier for amplifying an input LF signal, comprising:

means for generating a first pulse width modulated pulse train having a predetermined frequency, each of the pulses of said first pulse train having a predetermined height and the width of each of said pulses of said first pulse train being modulated as a function of said input signal;

means for generating a second pulse width modulated pulse train having said predetermined frequency, each of the pulses of said second pulse train having said predetermined height and the width of each of said pulses of said second pulse train being modulated as a function of said input signal;

first and second switch stage means, said first and second switch stage means receiving said first and second pulse trains, respectively, and each amplifying the pulses of said pulse train which it receives;

means for combining, in series, said first and second pulse trains after they have been amplified by said first and second switch stage means, respectively, to form a combined pulse train; and low pass filter means for filtering said combined pulse train.

2. The amplifier of claim 1, wherein the maximum width of each of said pulses after it has been modulated being such that when said first and second pulse trains are combined by said combining means the pulses of said combined pulse train do not overlap.

3. The amplifier of claim 1, wherein said means for generating said first and second pulse trains are for generating said first and second pulse trains simultaneously.

4. The amplifier of claim 1 or claim 3, wherein said means for generating said first and second pulse trains are for generating said first and second pulse trains continuously.

5. The amplifier of claim 1, wherein each pulse in said combined pulse train is representative of said input LF signal at a respective instant such that said combined pulse train is representative of said input LF signal.

6. The amplifier of claim 1 comprising a total of n means for generating n respective pulses width modulated pulse trains, n being an integer not less than 2, including said first and second pulse train generating means, for simultaneously generating n pulse trains, each of said n pulse trains including a plurality of pulses and having said predetermined frequency and each of said pulses having said predetermined height; each of said n pulse trains being width-modulated as a function of said input LF signal; and said amplifier further comprising a total of n switch stage means, including said first and second switch stage means, each of said n switch stage means receiving a respective one of said n pulse trains and amplifying the said pulse train which it receives.

7. The amplifier of claim 1, wherein said means for generating said first and second width-modulated pulse trains further comprises:

pulse generator means for generating a first unmodulated pulse train having said predetermined frequency and consisting of pulses having said predetermined height and having a predetermined width;

first phase shift circuit means for receiving said first unmodulated pulse train and phase-shifting it to produce a second unmodulated pulse train having said predetermined frequency and consisting of pulses having said predetermined height and said predetermined width and shifted in phase relative to said first unmodulated pulse train by a predetermined amount; and first and second modulator circuit means for receiving said first and second unmodulated pulse trains, respectively, and for pulse width modulating said input LF signal on them to generate said first and second pulse width modulated pulse trains, respectively.

8. The amplifier of claim 7, wherein said first phase shift circuit means phase-shifts said first unmodulated pulse train by 180° to generate said second unmodulated pulse train.

9. The amplifier of claim 7, wherein said means for generating said first and second width-modulated pulse trains further comprises a total of n means for generating n respective pulse width modulated pulse trains, n being an integer not less than 2, for simultaneously generating n pulse trains, said n pulse trains including said first and second pulse width modulated pulse trains; each of said n pulse trains including a plurality of pulses and having said predetermined frequency and each of said pulses having said predetermined height; said n pulse trains being width-modulated as a function of said input LF signal; and said amplifier further comprising a total of n switch stage means, including said first and second switch stage means, each of said n switch stage means receiving a respective one of said n pulse trains and amplifying the said pulse train which it receives.

10. The amplifier of claim 9, wherein said means for generating said pulse width-modulated pulse trains further comprises:

a total of n-1 phase shift circuit means, including said first phase shift circuit means, said n-1 phase shift circuit means being connected in parallel with each other; each of said n-1 phase shift circuit means being for receiving said first unmodulated pulse train and for phase-shifting it a respective predetermined amount to produce n-1 additional unmodulated pulse trains having said predetermined frequency and each consisting of pulses having said predetermined height and said predetermined width; and a total of n modulator circuit means connected in parallel with each other and including said first and second modulator circuit means, each of said n modulator circuit means being for receiving a respective one of said n unmodulated pulse trains and pulse-width modulating said input LF signal thereon to generate said n pulse-width modulated pulse trains.

11. The amplifier of claim 10, wherein said n-1 phase shift circuit means are for phase-shifting said first unmodulated pulse train in such a manner that no two said n unmodulated pulse trains are in phase with each other and such that the difference in phase between any two of said n unmodulated pulse trains is an integral multiple of 360°/n.

12. The amplifier of claim 6 or claim 11, wherein n is an even integer.

13. The amplifier of claim 7 or claim 10, wherein each of said switch stage means comprises a switch element and a power transformer; said switch element being for actuating said power transformer responsive to a pulse of the said pulse train received by that said switch stage means, and said power transformer being for generating an amplified pulse responsive to being actuated by said switch element, said amplified pulse having the same width as said pulse responsive to which said switch element has actuated said power transformer.

14. The amplifier of claim 13, wherein each of said switch stage means comprises at least first and second said switch elements and wherein said power transformer has a primary winding having first and second ends; and said first and second switch elements each being for generating a respective signal and applying it to said first or second end of said primary winding of said power transformer, respectively.

15. The amplifier of claim 14, wherein each said switch stage means comprises a control circuit for controlling said switch elements responsive to the pulses of said pulse train which is received by said switch stage.

16. The amplifier of claim 14, wherein said switch stage means each comprise a respective control circuit including a respective additional transformer; each said additional transformer having a respective secondary winding corresponding to each switch element in that said switch stage means.

17. The amplifier of claim 14, wherein said at least two switch elements of each said switch stage means are connected in parallel with each other.

18. The amplifier of claim 14, wherein at least some of said switch elements are power semiconductors.

19. The amplifier of claim 17, wherein at least some of said switch elements are power semiconductors.

20. The amplifier of claim 18, wherein at least some of said switch elements are electron tubes.

21. The amplifier of claim 19, wherein at least some of switch elements are electron tubes.

22. The amplifier of claim 14, wherein at least some of switch elements are electron tubes.

23. The amplifier of claim 17, wherein at least some of switch elements are electron tubes.

24. The amplifier of claim 6 or claim 10, wherein each of said switch stage means has two outputs; and said amplifier further comprising a respective diode connecting said two outputs of each said switch stage means.

25. The amplifier of claim 24, further comprising additional diodes, each of which is connected in series with one of said outputs of a respective one of said switch stage means, said additional diodes connecting said switch stage means in the form of a cascade circuit.

26. The amplifier of claim 6 or claim 10, wherein said means for combining said amplified pulses to form said combined pulse train applies said combined pulse train to said low pass filter means.

27. The amplifier of claim 10, wherein said low pass filter means comprises n low pass filters, each of said n low pass filters filtering the output of a respective one of said n switch stage means, and wherein the outputs of said n low pass filters are combined by said means for combining said amplified pulses to form said combined pulse train.

28. The amplifier of claim 10, further comprising n additional switch stage means, each of said 2n switch stage means being connected in parallel with a respective other one of said 2n switch stage means.

29. The amplifier of claim 1, claim 6 or claim 10, wherein said amplifier generates an output signal which is applied to the high frequency power stage of an amplitude modulated transmitter.

30. An LF power amplifier for amplifying an input LF signal, comprising:
   means for generating a first pulse width modulated pulse train having a predetermined frequency, each of the pulses of said first pulse train having a predetermined height and the width of each of said pulses of said first pulse train being modulated as a function of said input signal;
   means for generating a second pulse width modulated pulse train having said predetermined frequency, each of the pulses of said second pulse train having said predetermined height and the width of each of said pulses of said second pulse train being modulated as a function of said input signal;
   first and second switch stage means, said first and second switch stage means receiving said first and second pulse trains, respectively, and each amplifying the pulses of said pulse train which it receives, each of said switch stage means having two outputs;
   means for combining said first and second pulse trains after they have been amplified by said first and second switch stage means, respectively, to form a combined pulse train, said means for combining including:
   (A) a respective diode connecting said two outputs of each said switch stage means, and
   (B) additional diodes, each of which is connected in series with one of said outputs of a respective one of said switch stage means, said additional diodes connecting said switch stage means in the form of a cascade circuit, and
   low pass filter means for filtering said combined pulse train.

31. The amplifier of claim 1 or claim 30 in which the input signal has both positive and negative polarity, said first pulse train being modulated as a function of both polarities of said input signal, and said second pulse train also being modulated as a function of both polarities of said input signal.

32. The amplifier of claim 1 or claim 30 further comprising means for supplying a D.C. operating voltage to said first and second switch stage means, in which said means for combining combines said first and second pulse trains so that said combined pulse train has a maximum voltage greater than said D.C. operating voltage.

33. The amplifier of claim 32 in which said first switch means has an input for receiving said first pulse train and said second switch means has an input for receiving said second pulse train, each of said switch means further comprising an output which is galvanically separated from said input.

* * * * *